United States Patent [19]
Cho

[11] Patent Number: 5,975,108
[45] Date of Patent: Nov. 2, 1999

[54] AUTOMATIC DRAIN COLLECTING AND EXHAUSTING APPARATUS FOR SEMICONDUCTOR FABRICATION SYSTEM

[75] Inventor: Byung Sup Cho, Cheongju, Rep. of Korea

[73] Assignee: LG Semicon Co., Ltd., Cheongju, Rep. of Korea

[21] Appl. No.: 09/048,257

[22] Filed: Mar. 26, 1998

[30] Foreign Application Priority Data

Mar. 29, 1997 [KR] Rep. of Korea ................ 97/11422

[51] Int. Cl.[6] .................................................. F04F 3/00
[52] U.S. Cl. ..................................... 137/205; 137/571
[58] Field of Search ..................................... 137/205, 571

[56] References Cited

U.S. PATENT DOCUMENTS

| | | | |
|---|---|---|---|
| 4,325,663 | 4/1982 | Lee | 210/168 X |
| 5,223,156 | 6/1993 | Maier | 137/571 X |
| 5,330,072 | 7/1994 | Ferri et al. | 137/205 X |
| 5,380,446 | 1/1995 | Bratten | 210/783 X |
| 5,466,380 | 11/1995 | Bratten | 210/168 X |
| 5,496,469 | 3/1996 | Scraggs et al. | |
| 5,575,307 | 11/1996 | Martinitz | 137/205 |
| 5,590,678 | 1/1997 | Martinitz et al. | 137/205 |
| 5,593,596 | 1/1997 | Bratten | 210/168 X |

*Primary Examiner*—Gerald A. Michalsky

[57] ABSTRACT

A method and apparatus for automatically collecting and exhausting drainage discharged from a semiconductor fabrication system, including a drainage collector for storing drainage discharged from the semiconductor fabrication system, a drainage tank for storing the drainage output from the drain collector, and a liquid separator provided between the drainage collector and the drainage tank. The drainage collector receives and stores the drainage output from the drain collector. The liquid separator, provided between the drainage collector and the drainage tank, receives and stores the drainage output from the drainage collector under a first condition in accordance with a difference between a vacuum pressure and the atmospheric pressure, and allows the drainage stored in the drainage collector to flow into the drainage tank in a second condition based on a difference between the vacuum pressure and atmospheric pressure. Chemical drainage, such as organic solvent, is exhausted from the system based on a difference in pressure between the vacuum pressure and the atmospheric pressure, enabling a small capacity drain collector to be used.

19 Claims, 3 Drawing Sheets

AUTOMATIC DRAIN COLLECTING AND EXHAUSTING APPARATUS FOR SEMICONDUCTOR FABRICATION SYSTEM

BACKGROUND OF THE INVENTION

1. Field of the Invention

The present invention relates to a drain collecting apparatus for a semiconductor fabrication system, and more particularly to an improved automatic drain collecting and exhausting apparatus for a semiconductor fabrication system which enables discharge of drained chemicals such as organic solvents from the system.

2. Description of the Prior Art

As shown in FIG. 1, a conventional automatic drain collecting and exhausting apparatus for a semiconductor fabrication system includes a drain collector 2 for temporarily storing discharged drainage from a semiconductor fabrication system 1 when a process is completed.

In the conventional apparatus, a low sensor 3 and a full sensor 4 are connected to an outside wall of collector 2, each sensing a level of drainage output from fabrication system 1. Adjacent to drain collector 2, a drain tank 5 is provided for storing the drainage transmitted from drain collector 2. A plurality of tubes connect drain collector 2 and drain tank 5, enabling drainage flow therebetween.

A connection structure for linking drain collector 2 and drain tank 5 includes: a first tube 6 connecting drain collector 2 to a port of an air pump 9 via a first air valve 11, a second tube 7 connecting air pump 9 to drain tank 5, and a third tube 8 connecting drain tank 5 to the exterior via a second air valve 12.

A first sub-tube 6a connects a thinner container 17 to a portion of first tube 6 that is positioned between first air valve 11 and air pump 9. A second sub-tube 7a is connected, via a valve 14, to a portion of second tube 7 that is positioned between air pump 9 and drain tank 5. Reference numeral 15 denotes an alarm sensor, reference numeral 16 denotes a full sensor, and reference numerals 11a, 12a, 13a denote air springs for supporting respective air valves 11, 12, 13.

The operation of the above-described conventional drain collecting and exhausting apparatus for a semiconductor fabrication system will now be described.

The level of drainage discharged from the system 1 and collected in drain collector 2 increases as a semiconductor fabrication process is repeated in the system 1. At some point, full sensor 4 is actuated in response to the increasing level of discharged drainage. When full sensor 4 is actuated, the first air valve 11 is opened. Air pump 9 creates an air pressure difference which causes the drainage stored in drain collector 2 to be transmitted through first and second tubes 6, 7 to drain tank 5.

When a sufficient amount of drainage is transmitted from drainage collector 2 to drain tank 5 and a drain level in drain collector 2 is lowered, the low sensor 3 attached to the outside wall of drain collector 2 becomes actuated to open the third air valve 13. When third air valve 13 is opened, thinner in the thinner container 17 flows into air pump 9 for a predetermined time (about 5 to 10 seconds), diluting any high viscosity drainage in the air pump 9. The second air valve 12 is subsequently employed to exhaust the drainage from drain tank 5 to the exterior.

The above-described drain collecting and exhausting apparatus for the conventional semiconductor fabrication system experiences frequent air pump breakdown. Following each such breakdown, the drainage must be manually collected and exhausted, during which time the fabrication system 1 is rendered inoperable.

Further, due to frequent inactivation of the full sensor and the low sensor, the drainage collector can easily overflow, effectively contaminating the surroundings of the system and increasing the amount of thinner required.

Still further, the conventional system is expensive since the ratio of the system to the drain collecting apparatus is approximately 1:1 or 2:1.

SUMMARY OF THE INVENTION

It is an object of the present invention to provide a method and apparatus for automatically collecting and exhausting drainage from a semiconductor fabrication system without experiencing the conventional problems described above.

It is also an object of the present invention to provide a method and apparatus for automatically collecting and exhausting chemical drainage, such as an organic solvent from a semiconductor fabrication system, once per process by using a pressure difference between a vacuum and the atmosphere so that drainage collectors having decreased capacity can be used.

It is another object of the present invention to provide a method and apparatus for automatically collecting and exhausting drainage from a semiconductor fabrication system, which method and apparatus prevent contamination of the surroundings by storing up to a predetermined amount of drainage for a predetermined time, and decreasing cost by simultaneously collecting plural kinds of drainage discharged from plural systems using a single apparatus.

To achieve the above and other objects, there is provided a method and apparatus for automatically collecting and exhausting drainage from a semiconductor fabrication system which includes a drainage collector for storing therein drain discharged from the semiconductor fabrication system, a drain tank for storing therein the drainage outputted from the drainage collector, and a liquid separator provided between the drainage collector and the drain tank for receiving and storing therein the drainage outputted from the drain collector under a first condition in accordance with a difference between a vacuum and the atmosphere, and for passing the drainage stored therein into the drain tank under a second condition in accordance with a difference between the vacuum and the atmosphere.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to the accompanying drawings, a method and apparatus for automatically collecting and exhausting drainage discharged from a semiconductor fabrication system according to the present invention will now be described.

Figure 1:
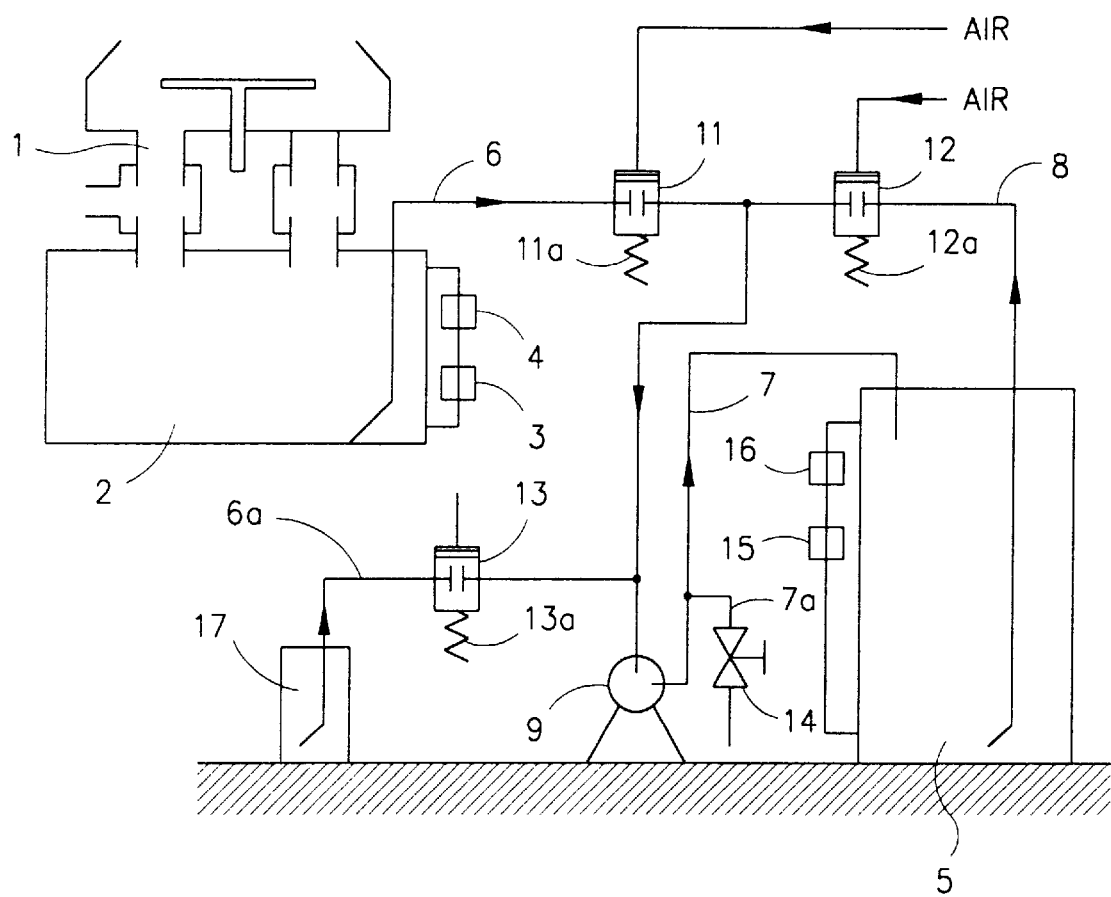
FIG. 1 is a schematic view of a conventional automatic drainage collecting and exhausting apparatus for a semiconductor fabrication system.
Figure 2:
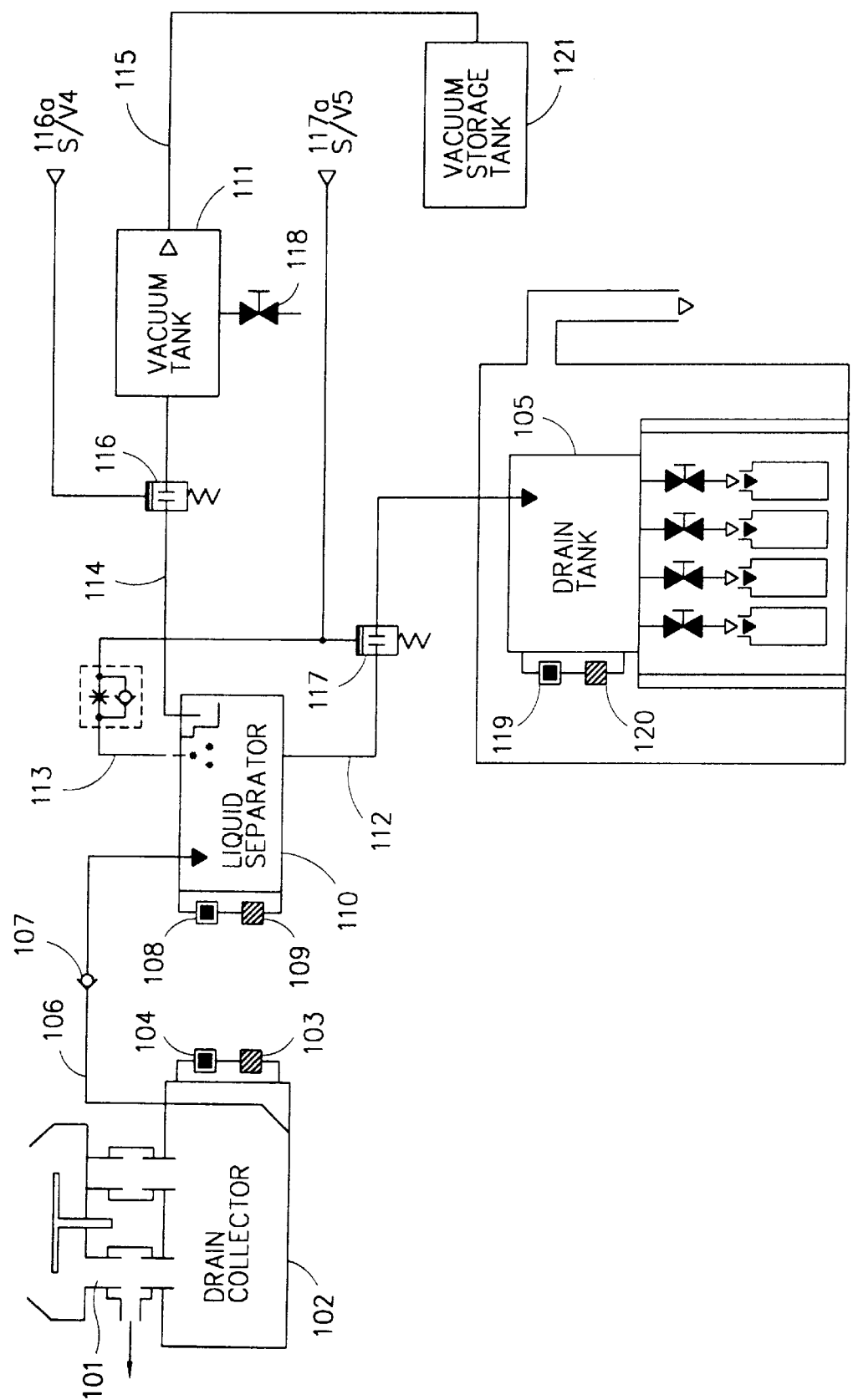
FIG. 2 is a schematic view of an automatic drain collecting and exhausting apparatus for a semiconductor fabrication system according to a first embodiment of the present invention.

FIG. 2 illustrates a first embodiment of the automatic drain collecting and exhausting apparatus of the present invention, including drain collector 102, drain tank 105, liquid separator 110, vacuum tank 111, and vacuum storage tank 121. Drain collector 102 is positioned below a semiconductor fabrication system 101 for temporarily storing drainage discharged from the semiconductor fabrication system 101.

An alarm sensor 103 and a safety sensor 104 are connected to an outside wall of the drain collector 102. Alarm sensor 103 senses a level of drainage discharged from the semiconductor fabrication system 101 and alerts the operator in response to overflow caused, for instance, by malfunction in valves 116 or 117. Safety sensor 104 detects malfunction of alarm sensor 103 and operates to stop the apparatus in the event of such a malfunction.

Drain tank 105 is provided adjacent to drain collector 102 for storing drainage expelled from drain collector 102.

A connection structure for linking the drain collector 102 and the drain tank 105 will now be described. A plurality of tubes connect drain collector 102 and drain tank 105 to transmit and receive drainage therebetween. Liquid separator 110 is provided adjacent to the drain collector 102. Liquid separator 110 communicates with the drainage collector 102 via a first tube 106. A check valve 107, which prevents drainage from being reversely flowed, is provided in a portion of the first tube 106 linking the drain collector 102 and the liquid separator 110. A safety valve 108 and an alarm sensor 109 are provided on an outside wall of the liquid separator 110. Alarm sensor 109 senses a level of the drainage in the liquid separator 110, and safety sensor 108 detects malfunction of alarm sensor 109.

A second tube 112 connects the bottom of the liquid separator 110 to the drain tank 105. A second air valve 117 is provided at a portion of the second tube 112 between the liquid separator 110 and the drain tank 105.

A third tube 113 connects an upper portion of the liquid separator 110 to a portion of the second air valve 117 that is connected to a second solenoid valve 117a. The upper portion of the liquid separator 110 is also connected via a fourth tube 114 to a vacuum tank 111 for extracting air from the liquid separator 110. A first air valve 116 is provided at a portion of the fourth tube 114 between the liquid separator 110 and the vacuum tank 111. The first air valve 116 is also connected to a first solenoid valve 116a.

The vacuum tank 111 is connected via a first connection tube 115 to vacuum storage tank 121. Reference numeral 118 identifies a valve connected to the vacuum tank 111, and reference numerals 119 and 120 respectively identify a safety sensor and an alarm sensor provided on an outside wall of drain tank 105. Alarm sensor 120 detects a level of drainage being outputted into the drain tank 105, and safety sensor 119 senses a malfunction of alarm sensor 120.

The operation of the above-described automatic drain collecting and exhausting apparatus for a semiconductor fabrication system will now be described in accordance with the first embodiment of the present invention.

For illustration purposes, the following description assumes that a stripping process is performed by the semiconductor fabrication system 101.

In a stripping process, when OMR thinner solution is sprayed over a wafer according to a program, an OMR rinse solution is sprayed over the wafer for a predetermined time in accordance with a predetermined rinse program, and the drainage is collected in the drain collector 102.

The fabrication system generally requires 45 to 70 seconds to process a sheet of wafer. Approximately, 0.3 to 1.5 cc of an organic solvent is used during the processing for a sheet of wafer depending on a process condition, and 80 to 100% of that organic solvent is collected in the form of effluent.

When the first solenoid valve 116a is opened during the rinse program, the first air valve 116 remains opened for 10 to 15 minutes for processing of a sheet of wafer. While the first air valve 116 remains open, air in the liquid separator 110 is exhausted in accordance with a suction pressure of the vacuum tank 111, creating a suction pressure in the liquid separator 110. The drainage stored in the drain collector 102 flows through the check valve 107 into the liquid separator 110 in accordance with the suction pressure of the liquid separator 110, causing the interior of the liquid separator 110 to maintain the state of the atmosphere when the first air valve 116 is closed.

Following the portion of the rinse program described above is a back rinse program. During the back rinse program, the second solenoid valve 117a is opened, causing the second air valve 117 to open and remain opened for a predetermined time. While second air valve 117 is open, air flows into the liquid separator 110, allowing drainage within the liquid separator 110 to flow into the drain tank 105.

The above-described operations are automatically carried out in accordance with respective programs, so that the drain tank 105 needs evacuating only once or twice per day, without consideration of an operation time of the semiconductor fabrication system 101.

Moreover, the suction amount and the exhaust amount of drainage can be controlled by simply adjusting an on/off time of the solenoid valves of the present invention.

When a malfunction is caused by problems with the valve 116 and/or the valve 117 in the apparatus according to the present invention, it is initially sensed by the alarm sensors 103, 120, which alert the operator. Further, when the alarm sensors 103, 120 malfunction, the safety sensors 104, 119 operate to stop the apparatus or otherwise alert an operator.

Figure 3:
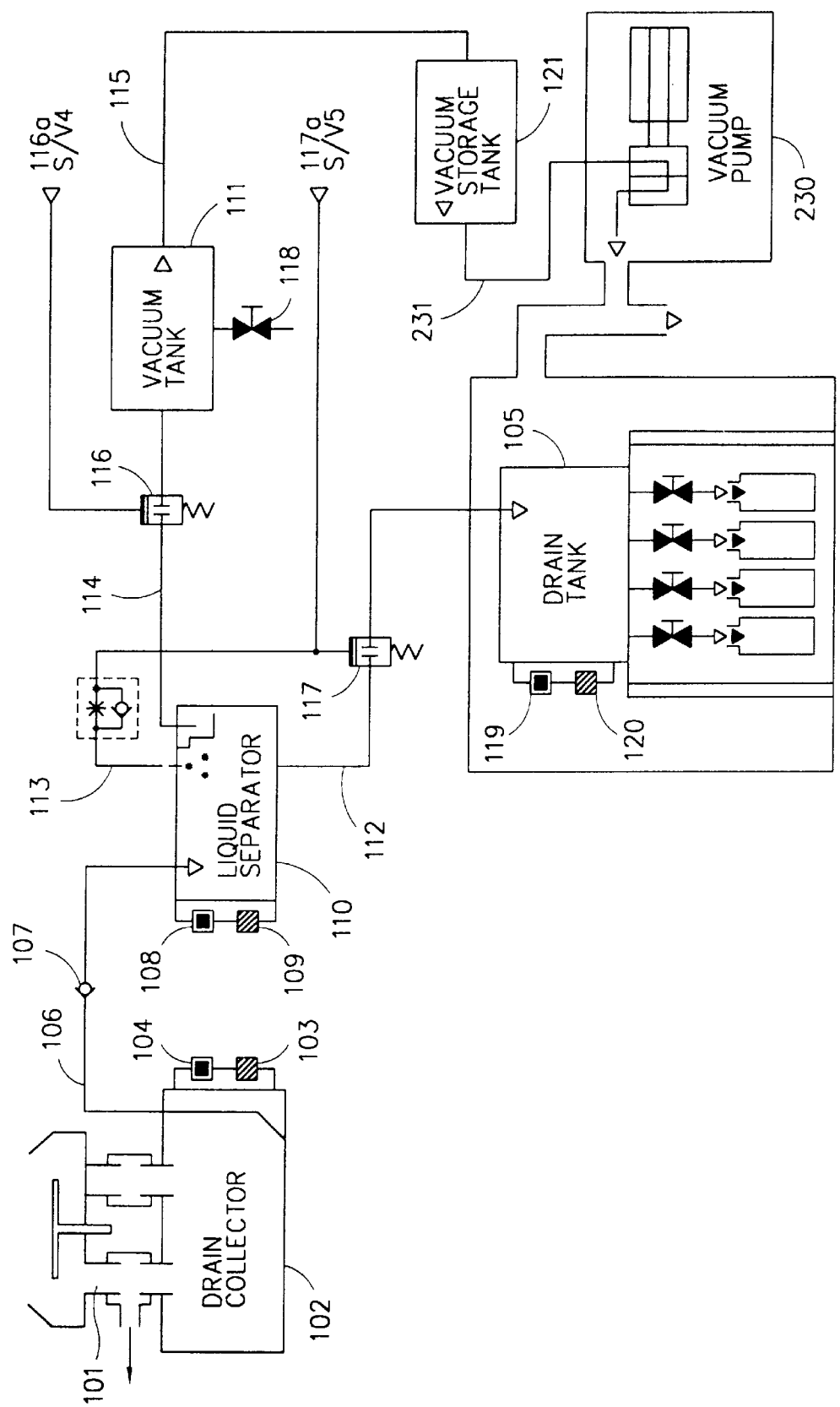
FIG. 3 is a schematic view of an automatic drain collecting and exhausting apparatus for a semiconductor fabrication system according to a second embodiment of the present invention.

FIG. 3 shows an automatic drain collection and exhausting apparatus for a semiconductor fabrication system in accordance with a second embodiment of the present invention. That apparatus includes a vacuum pump 230 for intensifying the local vacuum pressure rather than requiring a main vacuum source in the factory. The vacuum pump 230 is connected to the vacuum storage tank 121 through a connection tube 231.

As described above, the automatic drain collecting and exhausting apparatus for a semiconductor fabrication system according to the present invention collects chemical drainage, such as an organic solvent, using the pressure difference between a vacuum and the atmosphere, rather than a pump thereby avoiding frequent breakdowns.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. An automatic drain collecting and exhausting apparatus for a semiconductor fabrication system, comprising:

a drainage collector for storing drainage discharge from the semiconductor fabrication system;

a drainage tank for storing drainage output from the drainage collector;

a liquid separator, provided between the drainage collector and the drainage tank, for receiving and storing drainage output from the drainage collector under a first condition based on a vacuum pressure, and for outputting drainage under a second condition based on the vacuum pressure;

a vacuum pressure tank connected to a first air valve for extracting air from the liquid separator; and a vacuum storage tank connected to the vacuum pressure tank for retaining the vacuum pressure therein.

2. The apparatus of claim 1, further comprising:

first and second tubes connected to said liquid separator; and the first valve and a second air valve respectively connected to said first and second tubes.

3. The apparatus of claim 2, wherein:

the first air valve is connected to an upper portion of the liquid separator, the second air valve is connected to the drain tank, the second air valve being positioned between the liquid separator and the drain tank.

4. The apparatus of claim 3, wherein the first air valve is opened under a first condition, air being removed from within the liquid separator in accordance with a suction pressure of the vacuum pressure tank and the drainage stored in the drainage collector being output into the liquid separator in accordance with the pressure difference therebetween when the first air valve is opened.

5. The apparatus of claim 4, wherein the liquid separator maintains atmospheric pressure at the instant the first air valve is closed after setting the first condition.

6. The apparatus of claim 3, wherein the second air valve is opened under the second condition, where air flows into the liquid separator, and drainage flows from the liquid separator to the drainage tank when the second air valve is opened.

7. The apparatus of claim 3, further comprising:

a vacuum pump connected to the vacuum storage tank for intensifying the a vacuum pressure retained therein.

8. The apparatus of claim 3, further comprising:

alarm sensors for sensing a level of drainage; and safety sensors for detecting a malfunction of the alarm sensors, at least one of the alarm sensors and the safety sensors being attached to a side portion of each of the drainage collector, the drainage tank and the liquid separator;

wherein one of the alarm sensors sense an erroneous operation of the first valve.

9. The apparatus of claim 3, further comprising:

alarm sensors for sensing a level of drainage; and safety sensors for detecting a malfunction of the alarm sensors, at least one of the alarm sensors and the safety sensors being attached to a side portion of each of the drainage collector, the drainage tank and the liquid separator;

wherein one of the alarm sensors sense an erroneous operation of the second valve.

10. The apparatus of claim 2, wherein the first air valve and the second air valve respectively correspond to a first solenoid valve and a second solenoid valve.

11. The apparatus of claim 10, further comprising:

an on/off control for respectively controlling the first and second solenoid valves, an amount of the drainage flowing into the liquid separator and the drainage tank being controlled in accordance with the control by the on/off control.

12. The apparatus of claim 1, wherein the drainage discharged from the semiconductor fabrication system is temporarily stored in the drain collector each time a process of the semiconductor fabrication system is completed.

13. The apparatus of claim 1, further comprising:

alarm sensors for sensing a level of drainage; and safety sensors for detecting a malfunction of the alarm sensors, at least one of the alarm sensors and the safety sensors being attached to a side portion of each of the drainage collector, the drainage tank and the liquid separator.

14. The apparatus of claim 1, further comprising a tube connecting the drainage collector and the liquid separator; and a check valve for preventing drainage from flowing into the drainage collector from the liquid separator, the check valve being provided at a portion of the tube connecting the drainage collector and the liquid separator.

15. The apparatus of claim 1, wherein the liquid separator receives and outputs drainage in accordance with a difference between the vacuum pressure and an atmospheric pressure.

16. An automatic drain collecting and exhausting apparatus a semiconductor fabrication system, comprising:

a first tank for storing drainage discharged from the semiconductor fabrication system;

a second tank for storing drainage output from the first tank;

a liquid separator tank, provided between the first tank and the second tank, for receiving and storing drainage output from the first tank under a first preset condition, and for outputting the drainage under a second preset condition;

a vacuum system for applying a vacuum pressure;

a first air valve connected to the liquid separator tank and the vacuum system; and a second air valve connected to the second tank and the vacuum separator tanks.

17. The apparatus of claim 16, wherein the first air valve is opened under the preset first condition, air being removed from within the liquid separator tank in accordance with a suction pressure during the first preset condition.

18. The apparatus of claim 16, wherein the second air valve is opened under the second preset condition, where drainage stored in the first tank is output into the liquid separator tank in accordance with a pressure difference therebetween during the preset second condition.

19. The apparatus of claim 16, wherein the second air valve is opened under the second preset condition, air flowing into the liquid separator tank and drainage flowing from the third tank into the second tank during the second preset condition.

* * * * *